(12) United States Patent
Loy (10) Patent No.: US 10,247,757 B2
(45) Date of Patent: *Apr. 2, 2019

(54) ELECTRICITY METER FORMS MODULE (71) Applicant: Honeywell International Inc., Morris Plains, NJ (US)

(72) Inventor: Garry M Loy, Raleigh, NC (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,757

(22) Filed: Feb. 19, 2018

(65) Prior Publication Data

US 2018/0180646 A1    Jun. 28, 2018

Related U.S. Application Data (63) Continuation of application No. 15/197,012, filed on Jun. 29, 2016, now Pat. No. 9,921,245.

(60) Provisional application No. 62/187,503, filed on Jul. 1, 2015.

(51) Int. Cl.
| | |
|---|---|
| H02B 1/03 | (2006.01) |
| G01R 11/04 | (2006.01) |
| G01R 22/06 | (2006.01) |
| B29C 65/08 | (2006.01) |
| B29C 65/60 | (2006.01) |
| B29L 31/34 | (2006.01) |
| B29C 65/72 | (2006.01) |
| B29C 65/00 | (2006.01) |

(52) U.S. Cl.
CPC ............ G01R 11/04 (2013.01); G01R 22/065 (2013.01); H02B 1/03 (2013.01); B29C 65/08 (2013.01); B29C 65/606 (2013.01); B29C 65/72 (2013.01); B29C 66/54 (2013.01); B29C 66/7212 (2013.01); B29C 66/73921 (2013.01); B29L 2031/3481 (2013.01)

(58) Field of Classification Search
CPC .............................. G01R 11/04; G01R 22/065
USPC ........................................................ D10/100
See application file for complete search history.

(56) References Cited

U.S. PATENT DOCUMENTS

| | | | | |
|---|---|---|---|---|
| 2,105,396 A | | 1/1938 | Bakke | |
| 5,001,420 A | * | 3/1991 | Germer | G01R 11/02 324/114 |
| 5,023,747 A | * | 6/1991 | Lindsay | G01R 11/04 361/111 |
| 5,068,962 A | * | 12/1991 | Germer | G01R 11/02 29/830 |
| 5,364,290 A | * | 11/1994 | Hartman | G01R 11/04 361/659 |
| 5,586,913 A | | 12/1996 | Robinson | |
| 5,595,506 A | | 1/1997 | Robinson | |

(Continued)

*Primary Examiner* — Robert J Hoffberg (57) ABSTRACT

An improved meter base assembly supports the various meter forms used in modern electrical energy distribution systems. The disclosed assembly combines a customized design for each meter form with a universal base used in a plurality of meter forms to create a meter base assembly that is optimized for best performance while maintaining a reduced part cost. In addition, the concept allows the meter terminals to be attached to the meter base assembly without any hardware, may reduce assembly errors, allows for simplified assembly that may be automated, and speeds up the creation of future meter designs.

9 Claims, 9 Drawing Sheets

(56) References Cited

U.S. PATENT DOCUMENTS

| | | | |
|---|---|---|---|
| D409,934 S * | 5/1999 | Houck | D10/100 |
| 5,966,010 A | 10/1999 | Loy et al. | |
| 5,997,347 A | 12/1999 | Robinson et al. | |
| 6,275,168 B1 * | 8/2001 | Slater | G01R 22/00 324/110 |
| 6,409,537 B2 | 6/2002 | Robinson et al. | |
| 6,428,350 B1 | 8/2002 | Robinson et al. | |
| 6,443,761 B1 | 9/2002 | Robinson et al. | |
| 6,478,589 B2 * | 11/2002 | Robinson | H01R 13/44 361/1 |
| 6,589,072 B2 | 7/2003 | Robinson et al. | |
| 6,592,399 B2 | 7/2003 | Robinson et al. | |
| 6,605,937 B2 | 8/2003 | Germer et al. | |
| 6,612,866 B2 | 9/2003 | Germer et al. | |
| 6,754,067 B2 | 6/2004 | Turner et al. | |
| 6,838,867 B2 | 1/2005 | Loy | |
| 6,882,523 B2 | 4/2005 | Turner et al. | |
| 6,885,185 B1 * | 4/2005 | Makinson | G01R 22/066 324/142 |
| 7,253,605 B2 | 8/2007 | Burns | |
| 7,265,532 B2 | 9/2007 | Karanam | |
| 7,656,649 B2 * | 2/2010 | Loy | G01R 22/065 324/142 |
| 7,701,199 B2 * | 4/2010 | Makinson | G01R 22/066 324/142 |
| 8,002,578 B2 | 8/2011 | Robinson et al. | |
| 8,664,939 B2 | 3/2014 | Therrien et al. | |
| 9,921,245 B2 * | 3/2018 | Loy | G01R 11/04 |
| 10,048,088 B2 * | 8/2018 | Spanier | G01D 4/002 |
| 2012/0236472 A1 | 9/2012 | Nahar | |

* cited by examiner

ELECTRICITY METER FORMS MODULE

CROSS REFERENCE TO RELATED APPLICATIONS

The present application is a continuation of U.S. patent application Ser. No. 15/197,012, filed Jun. 29, 2016, which claims the benefit of and priority to U.S. Provisional Application No. 62/187,503, filed Jul. 1, 2015, the entire contents of which are incorporated by reference into this application.

BACKGROUND

Conventional American National Standards Institute (ANSI) approved watt-hour meters for electricity metering are designed for particular electrical energy distribution systems, such as single phase or polyphase systems. There are many different applications of distribution systems, each requiring a specific meter design, referred to as a "meter form." This traditionally requires meter manufacturers to have many different electricity meters to satisfy all meter forms required by the different distribution system applications. All of these different meter forms have certain physical dimensions in common, even though they each contain different metering circuitry. The meter base, or chassis that all components are mounted onto, must have, by ANSI requirement, the same external dimensions for all meter forms. Some meter manufacturers employ a different meter base design for each different meter form, while other meter manufacturers use a meter base design that has many features to support multiple meter forms. The latter concept is more common in the industry, even though that approach results in a series of design compromises, for the sake of economy.

The foregoing background discussion is intended solely to aid the reader. It is not intended to limit the innovations described herein. Thus, the foregoing discussion should not be taken to indicate that any particular element of a prior system is unsuitable for use with the innovations described herein, nor is it intended to indicate that any element is essential in implementing the innovations described herein. The implementations and application of the innovations described herein are defined by the appended claims.

SUMMARY

In one embodiment, a new meter base assembly has the advantages of a customized design for each meter form, such as a design optimized for best performance and lowest cost, with the economy of a common, universal meter base used in all meter forms.

In one embodiment, the electrical energy meter base assembly includes a forms module that is adapted to support a specific meter form. The forms module has an inner surface and an outer surface. The forms module inner surface includes mechanical features to support meter components used in the specific meter form. The electrical energy meter base assembly also includes a universal base that has an inner surface, an outer surface, and a plurality of openings that are shaped to receive a plurality of meter terminals and configured to enable the universal base to support a plurality of meter forms. Upon assembly, the forms module outer surface abuts the universal base inner surface.

In another embodiment, the electrical energy meter base assembly includes a universal base configured to support a plurality of meter forms and a forms module configured to support a specific meter form. The universal base has an inner surface and an outer surface that is opposite the inner surface. The universal base includes a plurality of terminal slots that extend from the universal base inner surface to the universal base outer surface. The universal base also includes a plurality of keys that project from the universal base inner surface and are positioned to one side of, and parallel to, a long axis of each of the terminal slots. The forms module has an inner surface and an outer surface opposite the inner surface. The forms module includes a plurality of keyhole slots that extend from the forms module inner surface to the forms module outer surface. Upon assembly, the forms module outer surface abuts the universal base inner surface such that the plurality of keys are disposed inside respective keyhole slots.

This Summary is provided to introduce a selection of concepts in a simplified form that are further described below in the Description of Illustrative Embodiments section. This Summary is not intended to identify key features or essential features of the claimed subject matter, nor is it intended to be used to limit the scope of the claimed subject matter. Furthermore, the claimed subject matter is not constrained to limitations that solve any or all disadvantages noted in any part of this disclosure.

BRIEF DESCRIPTION OF THE DRAWINGS

The foregoing summary, as well as the following detailed description of various embodiments, is better understood when read in conjunction with the appended drawings. For the purpose of illustration, there are shown in the drawings exemplary embodiments of various aspects; however, the claimed subject matter is not limited to the specific instrumentalities disclosed. In the drawings:

DETAILED DESCRIPTION OF ILLUSTRATIVE EMBODIMENTS

Figure 10:
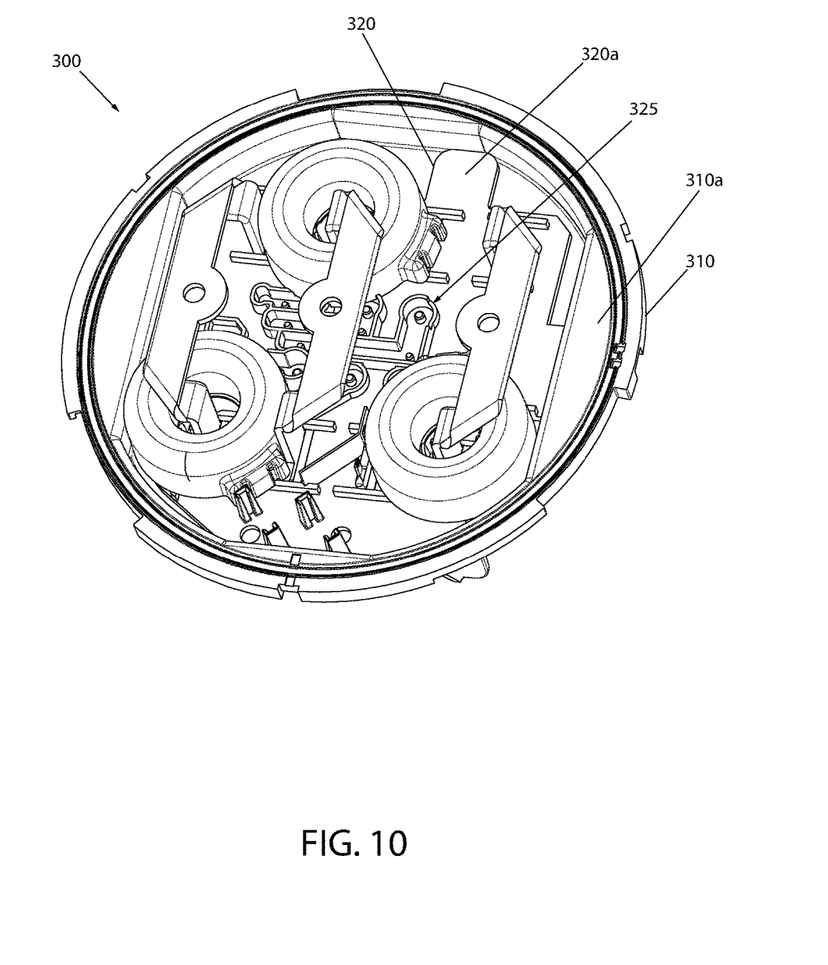
FIG. 10 is a perspective view of an exemplary polyphase meter assembly that illustrates the inside/inner surfaces of the universal base shown in FIG. 1 and an alternative embodiment of a forms module.
Figure 11:
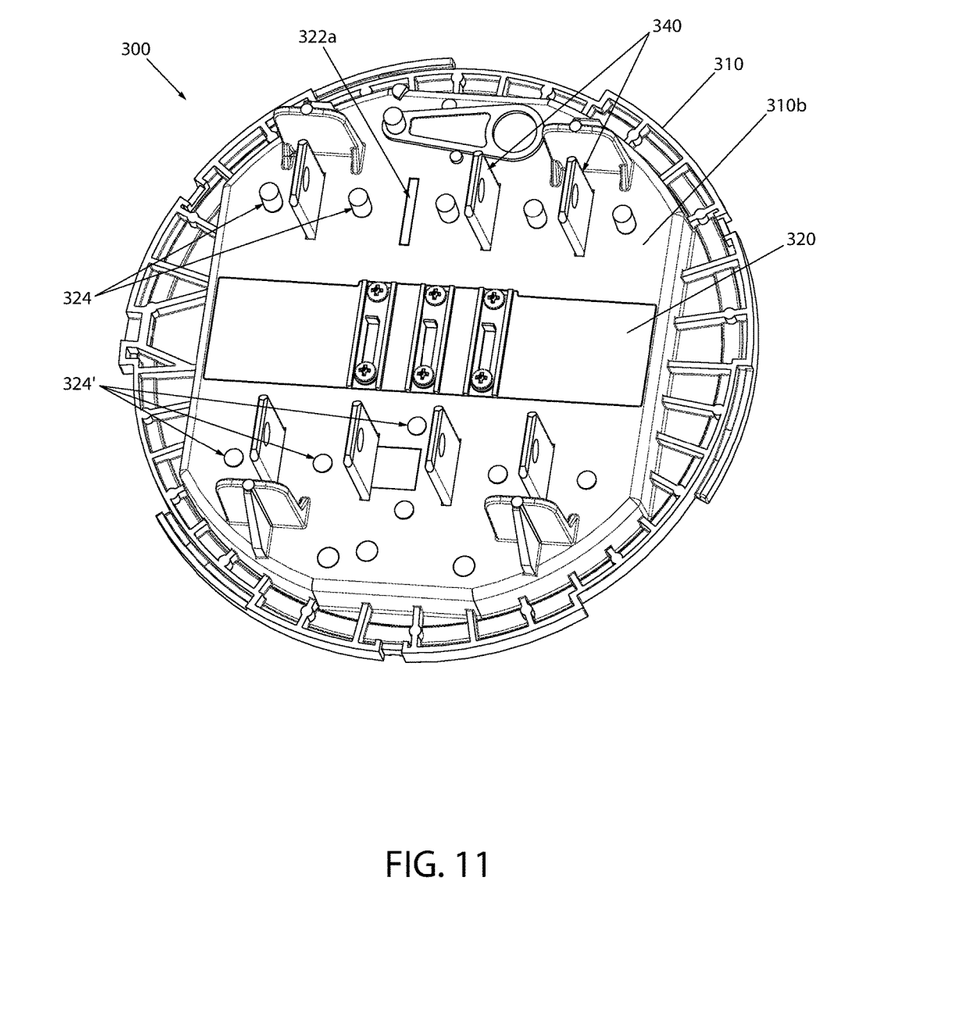
FIG. 11 is a perspective view of the meter assembly in FIG. 10 that illustrates the outside/our services of the universal base shown in FIG. 2 and an alternative embodiment of the forms module.

One embodiment of a meter base assembly adapted for a single phase electrical energy meter is described below with reference to FIGS. 1-8. An alternative embodiment of a meter base assembly adapted for a polyphase electrical meter is illustrated in FIGS. 10-11. Single phase meters are typically used in residential applications, and polyphase meters are typically used in commercial and industrial applications. The meter base assemblies, however, are described in detail for exemplary purposes only, as the various features of the disclosed embodiments may be incorporated into electrical-energy meters adapted for residential, commercial, and industrial uses. The description given herein with respect to those figures is not intended in any way to limit the scope of potential embodiments.

FIGS. 1-4 illustrate embodiments of the meter base assembly, which includes a universal base 10 and a forms module 20. The universal base 10 and forms module 20 may be molded from a glass reinforced thermoplastic material having the requisite mechanical, electrical, and thermal properties, flammability rating, UV stabilization, and resistance to common solvents such as insecticides and cleaning solutions. Examples of such thermoplastic material include Syndiotactic Polystyrene (SPS) (e.g., Idimitsu's XAREC) and Polybutylene Terephthalate (PBT) (e.g., Sabic's VALOX™).

Figure 1:
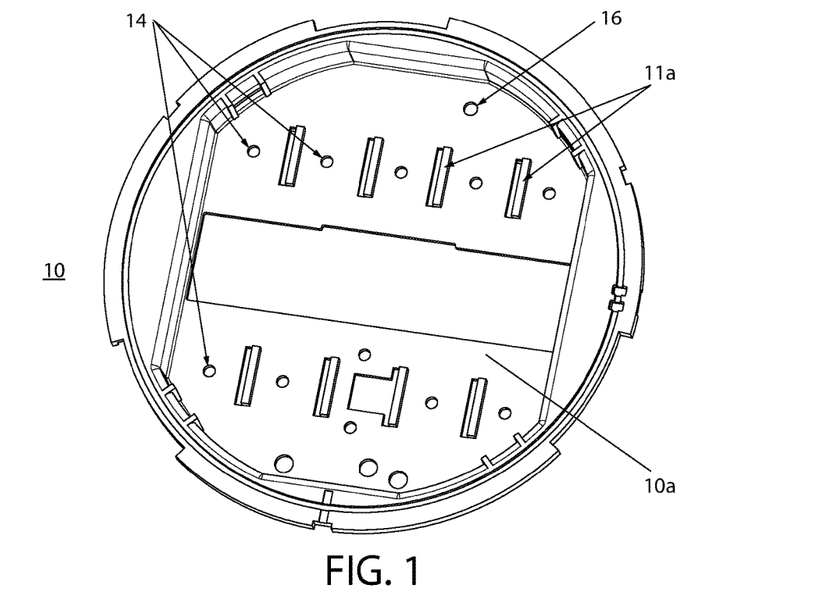
FIG. 1 is a perspective view of a universal base inside/inner surface, according to one embodiment.
Figure 2:
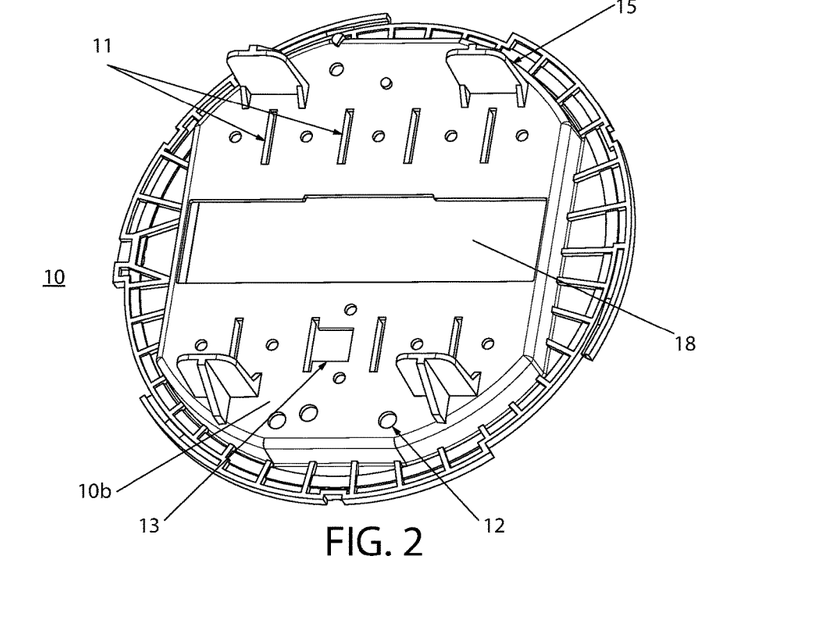
FIG. 2 is a perspective view of the outside/outer surface of the universal base shown in FIG. 1.

A universal base 10 is shown in detail in FIGS. 1 and 2. FIG. 1 illustrates the universal base inside or inner surface 10a, and FIG. 2 illustrates the universal base outside or outer surface 10b. The universal base 10 conforms to ANSI standards for meter base external dimensions and has a plurality of openings, such as meter terminal slots 11, voltage or neutral terminal slot 13, and external antenna connector holes 12 that enable the universal base 10 to support a plurality of possible meter forms. However, the universal base 10 does not have the inside mechanical features necessary to support meter components required by the various meter forms. As a result, the universal base 10 has a simplified, no undercuts design, which results in a low-profile part that may be easier and less expensive to manufacture than a conventional meter base.

As shown in FIG. 1, the universal base 10 has a plurality of keys 11a, which project from the universal base inner surface 10a, and are each positioned to one side of, and parallel to, the long axis of a meter terminal slot 11. The keys 11a are shaped to fit within keyhole slots 21a, 22, 23 in the forms module 20 when the forms module 20 is installed into the universal base 10 and the forms module outer surface 20b abuts the universal base inner surface 10a.

Figure 3:
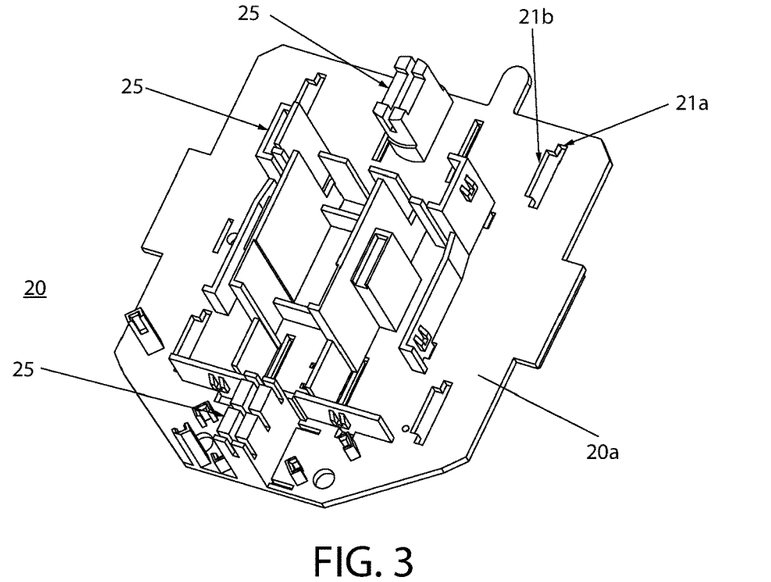
FIG. 3 is a perspective view of a forms module inside/inner surface, according to one embodiment.
Figure 4:
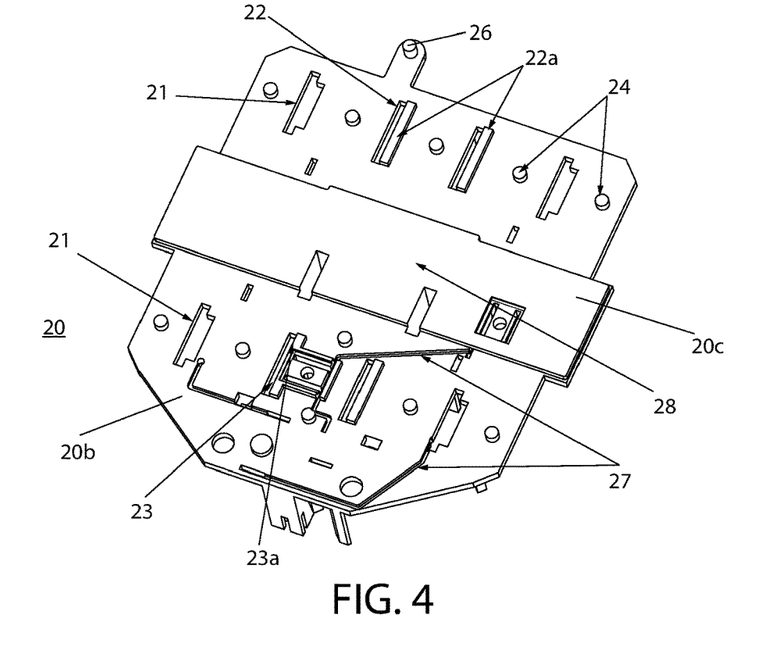
FIG. 4 is a perspective view of the outside/outer surface of the forms module shown in FIG. 3.
Figure 7:
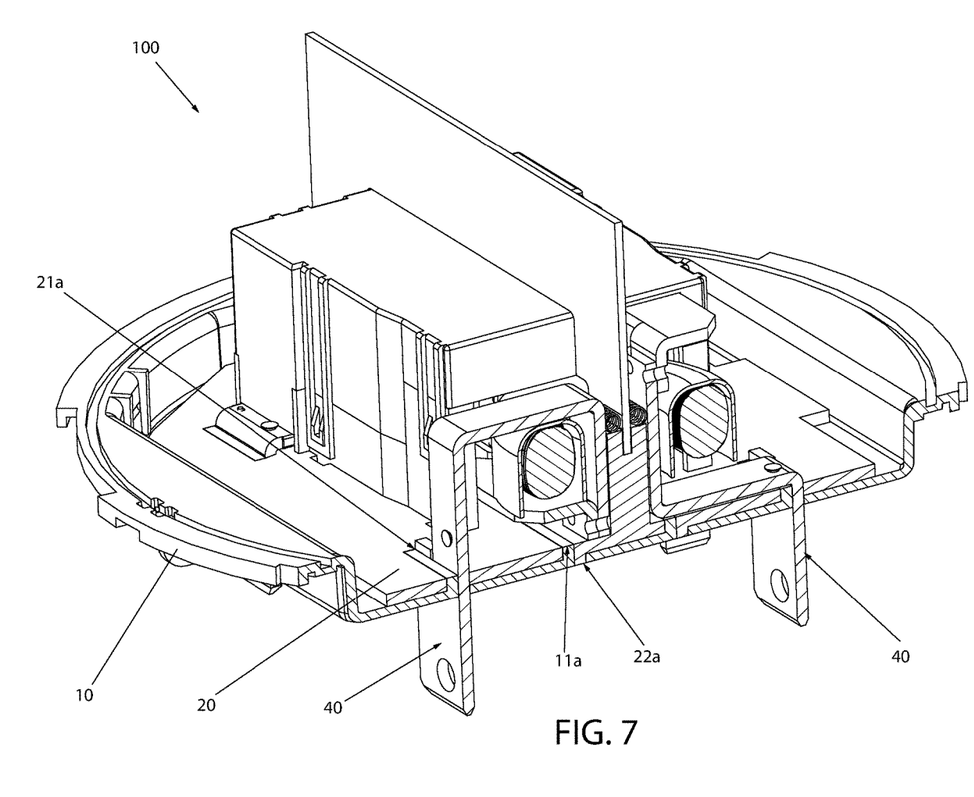
FIG. 7 is a section view through the meter assembly in FIGS. 5-6.

An embodiment of a forms module 20 is shown in detail in FIGS. 3 and 4. FIG. 3 illustrates the forms module inside or inner surface 20a, and FIG. 4 illustrates the forms module outside or outer surface 20b. As illustrated in FIGS. 4 and 7, the forms module 20 may contain various types of keyhole slots 21, 22, 23 depending on the particular meter form. As described in detail below, each of the keyhole slots 21, 22, 23 has a rectangular opening shaped to fit a corresponding key 11a projecting from the universal base inner surface 10a. When the forms module 20 is installed into the universal base 10, a corresponding key 11a is disposed inside each of the respective keyhole slots 21, 22, 23.

As best seen in FIGS. 3 and 10, the forms module 20, 320 is designed for a specific meter form. The forms module inner surface 20a, 320a contains mechanical features 25, 325, such as voltage barriers and supports for various meter components (e.g., circuit boards, current sensors, current conductors, voltage conductors, meter terminals, etc.) that are utilized in the particular meter form that the forms module is designed to accommodate.

For each different meter form, a corresponding form-specific forms module 20, 320 is assembled into the universal base 10, 310. The forms module may provide one or more of the following design features and benefits, presented by way of example and without limitation:

1) It effectively plugs or closes all unused openings in the universal base, resulting in a sealed meter.
2) It provides the necessary mechanical features such as voltage barriers, circuit board supports and current sensor mounts to support the meter form for which it was designed.
3) It is smaller than the universal base and other conventional meter base designs, allowing for more precise and efficient, lower cost molding.
4) It creates an additional protected space in the meter assembly that allows enclosed routing of voltage conductors.
5) It serves as the meter terminal locking feature, effectively attaching the meter terminals to the meter base assembly without mechanical hardware.
6) Its simplified, unique design for each meter form reduces the possibility of assembly errors.
7) It provides the opportunity for service disconnect switch integration into the meter base as a pre-tested unit.
8) It allows for simple, straightforward assembly which may be automated.
9) It provides a mechanical support for the ANSI required meter hanger on the back of the meter.
10) It simplifies and reduces the design and development time of future meter styles.

In the final assembled meter product, the forms module provides mechanical support for the meter terminals, current conductors, current sensors, voltage connections, and other various meter components. In one embodiment, the forms module is preassembled with these components and treated as a subassembly during meter manufacturing. Once the forms module subassembly is installed into the universal base, the two parts may be attached to each other using methods of joining thermoplastic parts, for example by: heat staking, ultrasonic welding, adhesives, and/or ultrasonic staking, utilizing features such as holes designed into the universal base and posts designed into the forms module for the purpose of attachment.

Figure 5:
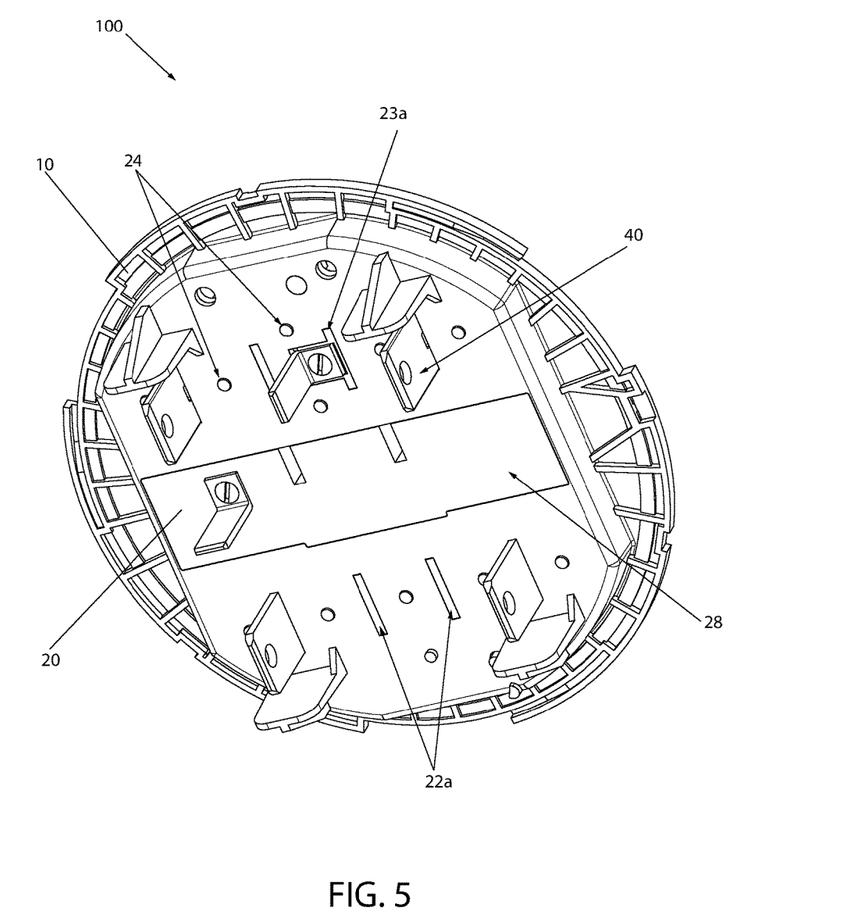
FIG. 5 is a perspective view of an exemplary single phase meter assembly that includes the universal base and forms module shown in FIGS. 1-4.
Figure 6:
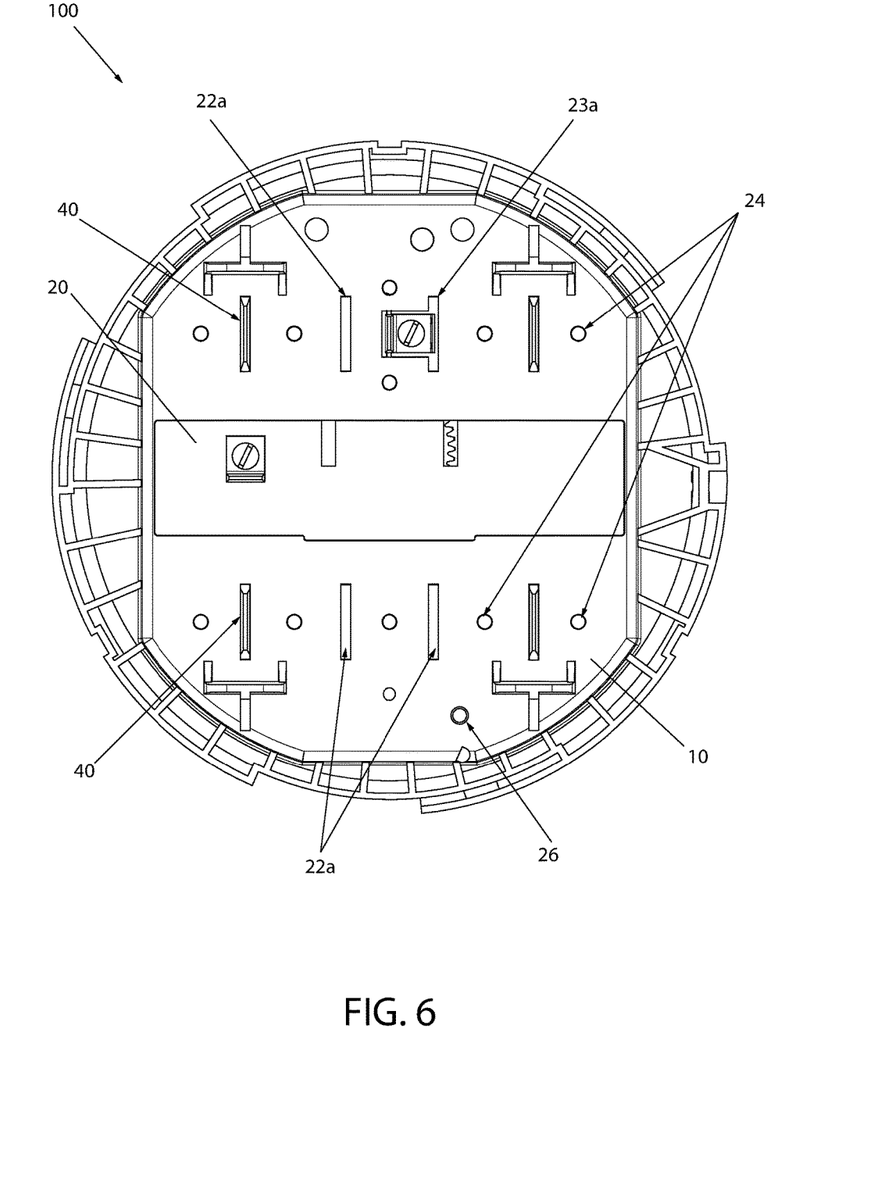
FIG. 6 is a plan view of the meter assembly in FIG. 5.
Figure 8:
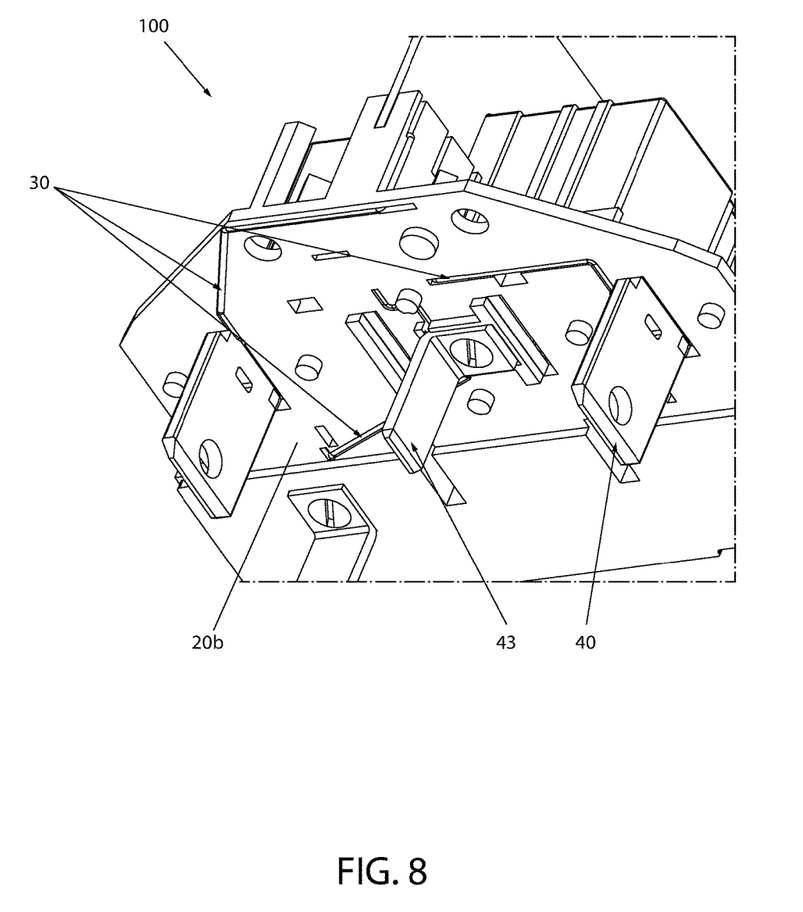
FIG. 8 is a perspective view of an exemplary forms module subassembly for the meter assembly shown in FIG. 5, according to an aspect of the disclosure.

FIGS. 5-6 show a meter assembly 100 that illustrates an exemplary embodiment of the forms module 20 installed in the universal base 10 and includes meter components, such as meter terminal 40. FIG. 7 is a cross-sectional view of meter assembly 100 that illustrates an exemplary embodiment of the meter terminal locking feature. FIG. 7 also illustrates an embodiment of the interlocking universal base keys 11a and forms module keyhole slots 21, 22, 23. FIG. 8 illustrates an exemplary forms module subassembly prior to installation into a universal base. As shown, the forms module subassembly includes the forms module 20 and meter components, such as meter terminals 40, voltage or neutral terminal 43, and voltage conductors 30.

Figure 9A:
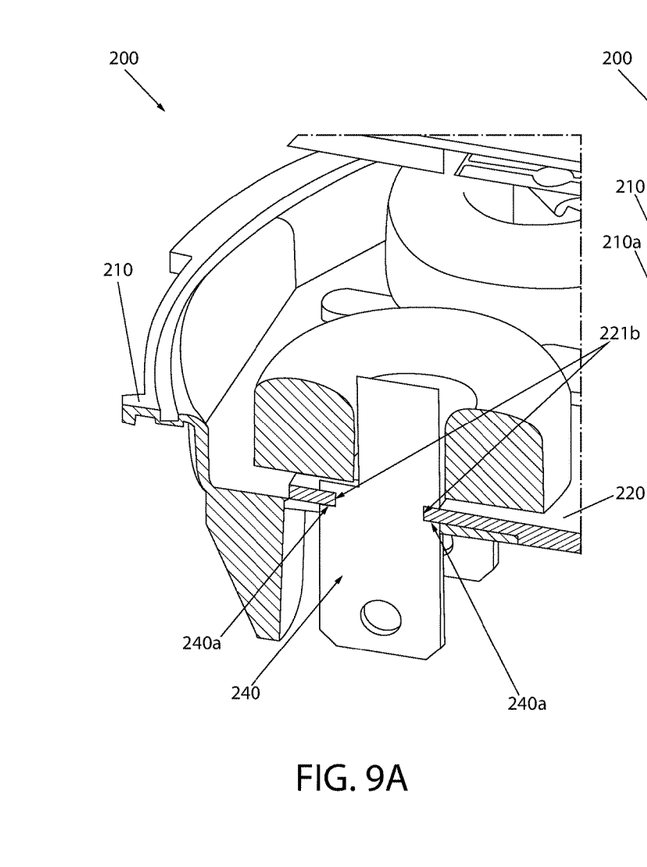
FIG. 9A is a section view through another exemplary meter assembly that highlights the interlocking meter terminal attachment features of a universal base and a forms module, according to an aspect of the disclosure.
Figure 9B:
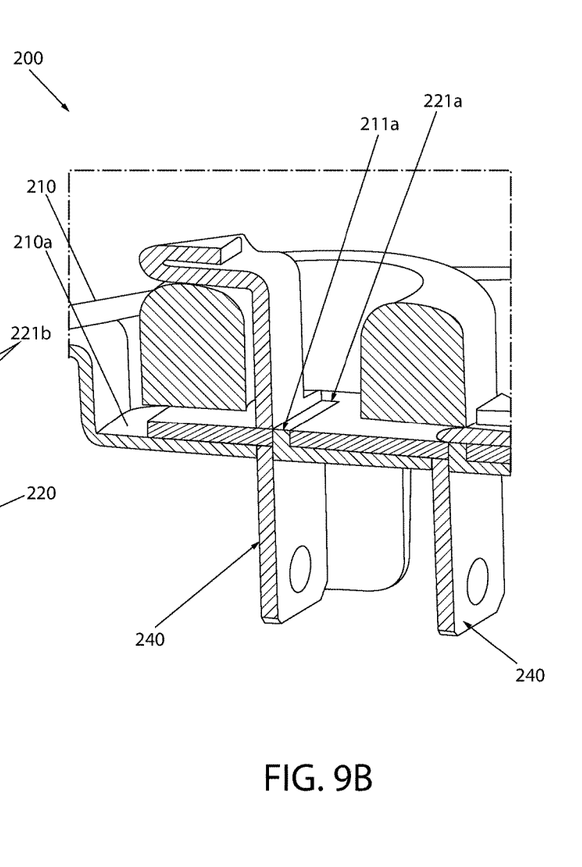
FIG. 9B is a section view of the meter assembly in FIG. 9A oriented 90° relative to FIG. 9A.

One advantage of the presently described meter base assembly is that it is able to retain the meter terminals without the use of fasteners. Instead, the meter terminals are retained in the meter base assembly by an interlocking system now to be described. Focusing on FIGS. 3, 4, 9A, and 9B, the system consists of interlocking notches in the sides of the meter terminals 40, 240 that engage and lock within keyhole slots 21 ("terminal keyhole slots") in the forms module. FIGS. 9A and 9B are cross-sectional views of meter assembly 200 that highlight the meter terminal interlocking system. FIG. 9A illustrates the notches 240a in meter terminal 240. Meter terminal 40 has notches 40a (not shown) that are similar to notches 240a in meter terminal 240.

As illustrated in FIG. 3, the terminal keyhole slots 21 are formed by two adjacent rectangular openings 21a, 21b. The large rectangular opening 21a, 221a is sized so that the full cross-sectional area of the meter terminal 40, 240 fits within the large rectangular opening 21a, 221a. Likewise, the small rectangular opening 21b, 221b is sized so that the narrow cross-sectional area of the terminal 40, 240 between the notches 40a, 240a fits within the small rectangular opening 21b, 221b.

As illustrated in FIG. 9A, after a meter terminal 40, 240 is inserted into the large opening 21a, 221a in a terminal keyhole slot 21, the meter terminal 40, 240 is moved laterally into a final position in the smaller opening 21b, 221b, which engages the interlocking notches 40a, 240a and securely holds the meter terminal 40, 240 in the forms module 20, 220 and prevents the meter terminal 40, 240 from moving axially of the forms module 20, 220.

Referring to FIGS. 7, 9A and 9B, when the forms module 20, 220 is installed into the universal base 10, 210, the terminal 40, 240 passes through a terminal slot 11 in the universal base 10, 210, and a key 11a, 211a projecting from the universal base inner surface 10a, 210a is inserted into the keyhole slot large opening 21a, 221a in the forms module 20, 220. The resulting contact between the key 11a, 211a and the meter terminal 40, 240 inhibits the meter terminal 40, 240 from backing out of the keyhole slot smaller opening 21b, 221b and secures the meter terminal 40, 240 in the meter base assembly.

The terminal keyhole slots 21, terminal slots 11, and keys 11a thus allow the meter terminals 40 to be installed in, secured to, and removed from the meter base assembly quickly and easily, without the use of external fasteners or tooling.

Turning to FIGS. 4-7, in embodiments for a meter form that does not require a meter terminal 40 at a particular universal base terminal slot 11, the forms module 20 is configured to contain a keyhole slot 22 and a terminal key 22a to seal the corresponding terminal slot opening. Terminal key 22a projects from the forms module outer surface 20b and is positioned to one side of, and parallel to, keyhole slot 22. Terminal key 22a is shaped to fit within terminal slot 11 in the forms module 10. Unlike terminal keyhole slot 21, which is configured with two rectangular openings to retain a meter terminal, keyhole slot 22 is a single rectangular opening configured and shaped to receive a key 11a. As best shown in FIGS. 5-7, when the forms module 20 is installed into the universal base 10, a key 11a projecting from the universal base inner surface 10a is inserted into a corresponding keyhole slot 22, and terminal key 22a projecting from the forms module outer surface 20b is inserted into a corresponding terminal slot 11, thereby effectively sealing the terminal slot 11.

Similarly, any voltage or neutral terminal slot 13 in the universal base 10 is sealed by a corresponding voltage or neutral terminal key 23a projecting from the forms module outer surface 20b. The forms module 20 is configured to contain a voltage or neutral terminal keyhole slot 23 that is shaped and positioned to accept a corresponding key 11a projecting from the universal base inner surface 10a. The forms module also includes a voltage or neutral terminal key 23a that projects from the forms module outer surface 20b and is shaped to fit within a corresponding voltage or neutral terminal slot 13. The voltage or neutral terminal key 23a is further configured to accept a voltage or neutral terminal 43. When the forms module 20 is installed into the universal base 10, a key 11a projecting from the universal base inner surface 10a is inserted into a corresponding voltage or neutral terminal keyhole slot 23, and the voltage or neutral terminal key 23a projecting from the forms module outer surface 20b is inserted into a corresponding voltage or neutral terminal slot 13, thereby effectively sealing the voltage or neutral terminal slot 13. In a likewise matter, any unused opening in the universal base 10 is sealed by a feature projecting from the forms module outer surface 20b.

As shown in FIGS. 1 and 7, the universal base 10 has a recessed central portion that is shaped to receive and locate the forms module 20. The universal base 10 and forms module 20 may also contain alignment features, such as post 26 on the forms module outer surface 20b and hole 16 in the universal base 10, that prevent the forms module 20 from being installed into the universal base 10 in an incorrect orientation.

The forms module 20 is installed into the universal base 10 by substantially aligning the meter terminals 40 projecting from the forms module outer surface 20b with the respective terminal slots 11 in the universal base 10. As the forms module outer surface 20b is moved toward the universal base inner surface 10a, the meter terminals 40 pass through the terminal slots 11. When assembled, the forms module outer surface 20b abuts the universal base inner surface 10a and the meter terminals are retained as described above. In addition, the unused terminal slots 11 in the universal meter base 10 are sealed by keys 22a on the forms module outer surface 20b as described above.

As shown in FIG. 4, the forms module 20 may contain a hanger support feature 28 that provides mechanical support for the ANSI required meter hanger on the back of the electrical energy meter. The hanger support feature 28 may be configured to directly contact the meter hanger. In such an embodiment, the universal base 10 includes an opening 18 shaped to receive the hanger support feature 28. As shown in FIGS. 2 and 4-6, the hanger support feature 28 is shaped to fit within, and substantially fill the universal base opening 18, such that when the forms module 20 is installed into the universal base 10, the forms module outer surface 20c at hanger support feature 28 substantially aligns with the universal base outer surface 10b.

As seen in FIGS. 4 and 8, the forms module outer surface 20b may contain grooves 27 that are sized and configured to accept and route voltage conductors 30 that connect various meter components to meter terminals 40, and voltage or neutral terminals 43. When the forms module 20 is installed into the universal base 10, the voltage conductors 30 are enclosed in the grooves 27 by the universal base inner surface 10a. Thus, after assembly, the universal base 10 and forms module 20 provide both mechanical support and dielectric protection for the voltage conductors 30.

In one embodiment, the voltage conductors 30 are phosphor bronze spring wire that serves as both an electrical conductor and an electrical connector that helps to create an environmentally robust connection at each end when the meter components and meter terminals are assembled. The connection has sufficient force at the point of contact to prevent oxidation and maintain a suitable electrical connection. The connection enables transmission of low-current signals between the voltage conductor 30 and meter components, such as a conductor pad on a circuit board.

In another embodiment illustrated in FIGS. 1, 2, and 4, the forms module 20 may include attachment features, such as posts 24 that project from the forms module outer surface 20*b*, and corresponding holes 14 in the universal base 10. As shown in FIG. 5, when the forms module subassembly is installed into the universal base 10, the posts 24 on the forms module outer surface 20*b* substantially align with, and are at least partially disposed in, corresponding holes 14 in the universal base 10. In one embodiment, the posts 24 on the forms module outer surface 20*b* project through the corresponding holes 14 and extend beyond the forms module outer surface 10*b*. The universal base 10 and forms module 20 may be joined to each other using the attachment features and methods of joining thermoplastic parts, for example heat staking, ultrasonic welding, adhesives, and/or ultrasonic staking.

FIG. 11 illustrates an embodiment of an exemplary joining process described above. The forms module 320 includes posts 324 that substantially align with, and are at least partially disposed in corresponding holes in the universal base 310. As shown, the posts 324 project through the corresponding holes in the universal base 310 and extend beyond the forms module outer surface 310*b*. After a heat staking and/or ultrasonic staking joining process, the posts 324 are transformed to the rivet-like features 324' that secure the forms module 322 to the universal base 310.

The use of a universal base 10 and customized forms module 20 design for each meter form has additional benefits. The forms module 20 is smaller than the universal base 10 and conventional meter bases, which allows the forms module 20 to be made by a more precise, efficient, and lower cost manufacturing process. Possible assembly errors may be reduced by the forms module 20 comprising only the mechanical features necessary to support the meter components used in the meter form. In contrast, meter base designs intended to support multiple meter forms include additional, unused mechanical features that may allow meter components to be installed in incorrect locations. Thus, a customized forms module 20 design may allow for simple, straightforward assembly that may be automated.

In addition, the various meter components may be installed on the forms module 20 and treated as a subassembly during meter manufacturing. As such, a completed forms module subassembly may be pretested before final assembly into the universal base 10. Importantly, that feature provides the opportunity for service disconnect switch integration into the meter base as a pre-tested unit.

While example embodiments and advantages have been described above, modifications and variations may be made without departing from the principles described above and set forth in the following claims. Accordingly, reference should be made to the following claims as describing the scope of the claimed subject matter.

What is claimed:

1. An electrical energy meter base assembly, comprising:
  a universal base comprising an inner surface, an outer surface, and a plurality of base openings shaped to receive a plurality of meter terminals and configured to enable the universal base to support a plurality of meter forms; and
  a selected one of a plurality of forms modules, each forms module of the plurality of forms modules adapted to support a specific one of the meter forms, wherein a first specific one of the meter forms is different from a second specific one of the meter forms, and wherein each forms module comprises an inner surface and an outer surface, the inner surface comprising mechanical features to support one or more meter components used in the specific one of the meter forms,
  wherein the selected one of the plurality of forms modules is coupled to the universal base so that the forms module outer surface abuts the universal base inner surface.

2. The electrical energy meter base assembly according to claim 1, wherein the one or more meter components comprise a plurality of voltage conductors, and
  wherein the selected one of the plurality of forms modules outer surface comprises grooves that are shaped and configured to accept and route the plurality of voltage conductors.

3. The electrical energy meter base assembly according to claim 2, wherein coupling the selected one of the plurality of forms modules to the universal base encloses the plurality of voltage conductors in the grooves by the universal base inner surface.

4. The electrical energy meter base assembly according to claim 2, wherein each voltage conductor of the plurality of voltage conductors is configured to connect at least one meter terminal of the plurality of meter terminals to at least one other meter component of the one or more meter components.

5. The electrical energy meter base assembly according to claim 4, wherein each voltage conductor of the plurality of voltage conductors further comprises a first end and a second end, the first end configured to contact the at least one meter terminal, and the second end configured to contact the at least one other meter component.

6. The electrical energy meter base assembly according to claim 5, wherein coupling the selected one of the plurality of forms modules to the universal base creates an environmentally robust connection at the first end and the second end of each voltage conductor.

7. The electrical energy meter base assembly according to claim 2, wherein the plurality of voltage conductors comprise phosphor bronze spring wire.

8. A method of assembling a meter comprising:
  providing a universal base, comprising an inner surface, an outer surface, and a plurality of base openings shaped to receive a plurality of meter terminals and configured to enable the universal base to support a plurality of meter forms;
  selecting one of a plurality of forms modules, each forms module of the plurality of forms modules adapted to support a specific one of the meter forms, wherein a first specific one of the meter forms is different from a second specific one of the meter forms, and wherein each forms module comprises an inner surface and an outer surface, the inner surface comprising mechanical features to support one or more meter components used in the specific one of the meter forms; and
  coupling the selected one of the forms modules to the universal base so that the forms module outer surface abuts the universal base inner surface.

9. The method of claim 8, further comprising attaching at least one meter component of the one or more meter components to the selected one of the forms modules prior to coupling the selected one of the forms modules to the universal base.

* * * * *